(12) United States Patent
Song

(10) Patent No.: US 12,412,618 B2
(45) Date of Patent: Sep. 9, 2025

(54) BUFFER CHIP, AND SEMICONDUCTOR PACKAGE INCLUDING BUFFER CHIP AND MEMORY CHIP

(71) Applicant: SK hynix Inc., Icheon-si (KR)

(72) Inventor: Choung Ki Song, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 157 days.

(21) Appl. No.: 18/509,188

(22) Filed: Nov. 14, 2023

(65) Prior Publication Data

US 2024/0249765 A1    Jul. 25, 2024

(30) Foreign Application Priority Data

Jan. 19, 2023  (KR) .................. 10-2023-0008378
Jan. 19, 2023  (KR) .................. 10-2023-0008379
Jan. 19, 2023  (KR) .................. 10-2023-0008380
Jan. 19, 2023  (KR) .................. 10-2023-0008381
Aug. 1, 2023   (KR) .................. 10-2023-0100176

(51) Int. Cl.
```
G11C 16/04      (2006.01)
G11C 11/4076    (2006.01)
H01L 23/00      (2006.01)
H01L 25/18      (2023.01)
H10B 80/00      (2023.01)
```
(52) U.S. Cl.
CPC .......... *G11C 11/4076* (2013.01); *H01L 24/48* (2013.01); *H01L 25/18* (2013.01); *H10B 80/00* (2023.02); *H01L 2224/48091* (2013.01); *H01L 2224/48227* (2013.01)

(58) Field of Classification Search
CPC ..... G11C 11/4076; H01L 24/48; H01L 25/18; H01L 2224/48091; H01L 2224/48227
See application file for complete search history.

(56) References Cited

U.S. PATENT DOCUMENTS

| | | | |
|---|---|---|---|
| 7,379,361 B2* | 5/2008 | Co ................. | G11C 29/808 |
| | | | 365/201 |
| 2018/0166105 A1* | 6/2018 | Choi ............... | G11C 5/04 |
| 2024/0249767 A1* | 7/2024 | Song ............... | H10B 80/00 |

* cited by examiner

*Primary Examiner* — Pho M Luu
(74) *Attorney, Agent, or Firm* — WILLIAM PARK & ASSOCIATES LTD.

(57) ABSTRACT

A buffer chip includes a control signal transmission path that transmitting, to a memory chip, control signals transmitted from a memory controller; a data transmission path including a variable delay circuit having a delay value adjusted by a delay code and transmitting, to the memory controller, data transmitted from the memory chip; a ring oscillator generating a ring oscillator clock; a counter circuit configured to count the number of toggles of the ring oscillator clock while an external clock toggles a reference number of times; a reference value storage circuit configured to store a counting value of the counter circuit as a reference value; a current value storage circuit configured to store the counting value of the counter circuit as a current value in response to a comparison signal; and a code generation circuit configured to generate the delay code by comparing the reference value with the current value.

11 Claims, 14 Drawing Sheets

BUFFER CHIP, AND SEMICONDUCTOR PACKAGE INCLUDING BUFFER CHIP AND MEMORY CHIP

CROSS-REFERENCE TO RELATED APPLICATION

This application claims priority under 35 U.S.C. § 119 (a) to Korean Patent Application No. 10-2023-0008378 filed on Jan. 19, 2023, Korean Patent Application No. 10-2023-0008379 filed on Jan. 19, 2023, Korean Patent Application No. 10-2023-0008380 filed on Jan. 19, 2023, Korean Patent Application No. 10-2023-0008381 filed on Jan. 19, 2023, and Korean Patent Application No. 10-2023-0100176 filed on Aug. 1, 2023, which are incorporated herein by reference in its entirety.

BACKGROUND

1. Technical Field

Embodiments of the present disclosure relate to a semiconductor package including a buffer chip and a memory chip, and a memory module including the same.

2. Related Art

Recently, as application fields utilizing artificial intelligence and big data increase, the amount of data to be processed is explosively increasing. Many computer systems (for example, data centers, servers, and the like) require a large amount of memory, and applications using the computer systems require a larger amount of memory than system capabilities. However, it is becoming increasingly difficult to add a memory to the computer system due to issues such as latency and bandwidths. Various methods for increasing the amount of a memory in a system while maintaining low latency and a high bandwidth are being studied.

SUMMARY

In an embodiment, a buffer chip may include: a control signal transmission path that transmitting, to a memory chip, control signals transmitted from a memory controller; a data transmission path including a variable delay circuit having a delay value adjusted by a delay code and transmitting, to the memory controller, data transmitted from the memory chip; a ring oscillator generating a ring oscillator clock; a counter circuit configured to count the number of toggles of the ring oscillator clock while an external clock toggles a reference number of times; a reference value storage circuit configured to store a counting value of the counter circuit as a reference value in response to a reference setting signal; a current value storage circuit configured to store the counting value of the counter circuit as a current value in response to a comparison signal; and a code generation circuit configured to generate the delay code by comparing the reference value with the current value.

In an embodiment, a buffer chip may include: a control signal transmission path that transmitting, to a memory chip, control signals transmitted from a memory controller; a data transmission path including a variable delay circuit having a delay value adjusted by a delay code and transmitting, to the memory controller, data transmitted from the memory chip; a ring oscillator generating a ring oscillator clock; a counter circuit configured to count the number of toggles of the ring oscillator clock while an external clock toggles a reference number of times; a reference value storage circuit configured to store a counting value of the counter circuit as a reference value in response to a reference setting signal; first to $N^{th}$ current value storage circuits configured to store the counting value of the counter circuit as first to $N^{th}$ current values at N different time points (N is an integer of 2 or more); first to $N^{th}$ comparison circuits configured to generate first to $N^{th}$ comparison results by comparing the reference value with the first to $N^{th}$ current values; and a code generation circuit configured to change a value of the delay code when the first to $N^{th}$ comparison results are identical to one another.

In an embodiment, an integrated circuit chip may include: a variable delay circuit having a delay value adjusted by a delay code and delaying an input signal; a ring oscillator generating a ring oscillator clock; a counter circuit configured to count the number of toggles of the ring oscillator clock while an external clock toggles a reference number of times; a reference value storage circuit configured to store a counting value of the counter circuit as a reference value in response to a reference setting signal; a current value storage circuit configured to store the counting value of the counter circuit as a current value in response to a comparison signal; and a code generation circuit configured to generate the delay code by comparing the reference value with the current value.

In an embodiment, a semiconductor package may include: a package substrate including a plurality of terminals for communicating with a memory controller and a plurality of bonding pads for communicating with components inside a package; a buffer chip disposed on the package substrate; a plurality of memory chips stacked on the buffer chip; and a plurality of wires connecting the plurality of bonding pads with the plurality of memory chips, wherein the buffer chip is configured to communicate with the memory controller through the plurality of terminals of the package substrate, wherein the plurality of memory chips is configured to communicate with the buffer chip through the plurality of wires and the plurality of bonding pads of the package substrate, and wherein the buffer chip may include: a control signal transmission path that transmitting, to the plurality of memory chips, control signals transmitted from the memory controller; a data transmission path including a variable delay circuit having a delay value adjusted by a delay code and transmits, to the memory controller, data transmitted from one of the plurality of memory chips; a ring oscillator generating a ring oscillator clock; a counter circuit configured to count the number of toggles of the ring oscillator clock while an external clock toggles a reference number of times; a reference value storage circuit configured to store a counting value of the counter circuit as a reference value in response to a reference setting signal; a current value storage circuit configured to store the counting value of the counter circuit as a current value in response to a comparison signal; and a code generation circuit configured to generate the delay code by comparing the reference value with the current value.

In an embodiment, a semiconductor package may include: a package substrate including a plurality of terminals for communicating with a memory controller and a plurality of bonding pads for communicating with components inside a package; a buffer chip disposed on the package substrate; a plurality of memory chips stacked on the buffer chip; and a plurality of wires connecting the plurality of bonding pads with the plurality of memory chips, wherein the buffer chip is configured to communicate with the memory controller through the plurality of terminals of the package substrate, wherein the plurality of memory chips is configured to communicate with the buffer chip through the plurality of wires and the plurality of bonding pads of the package substrate, and wherein the buffer chip may include: a control signal transmission path transmitting, to the plurality of memory chips, control signals transmitted from the memory controller; a data transmission path including a variable delay circuit having a delay value adjusted by a delay code and transmits, to the memory controller, data transmitted from one of the plurality of memory chips; a ring oscillator generating a ring oscillator clock; a counter circuit configured to count the number of toggles of the ring oscillator clock while an external clock toggles by a reference number of times; a reference value storage circuit configured to store a counting value of the counter circuit as a reference value in response to a reference setting signal; first to $N^{th}$ current value storage circuits configured to store the counting value of the counter circuit as first to $N^{th}$ current values at N different time points (N is an integer of 2 or more); first to $N^{th}$ comparison circuits configured to generate first to $N^{th}$ comparison results by comparing the reference value with the first to $N^{th}$ current values; and a code change circuit configured to change a value of the delay code when the first to $N^{th}$ comparison results are identical to one another.

DETAILED DESCRIPTION

Various embodiments are directed to reducing loading due to an increase in a memory while increasing the capacity of the memory.

Embodiments of the present disclosure can reduce loading due to an increase in a memory while increasing the capacity of the memory.

Hereafter, embodiments in accordance with the technical spirit of the present disclosure will be described with reference to the accompanying drawings.

Figure 1:
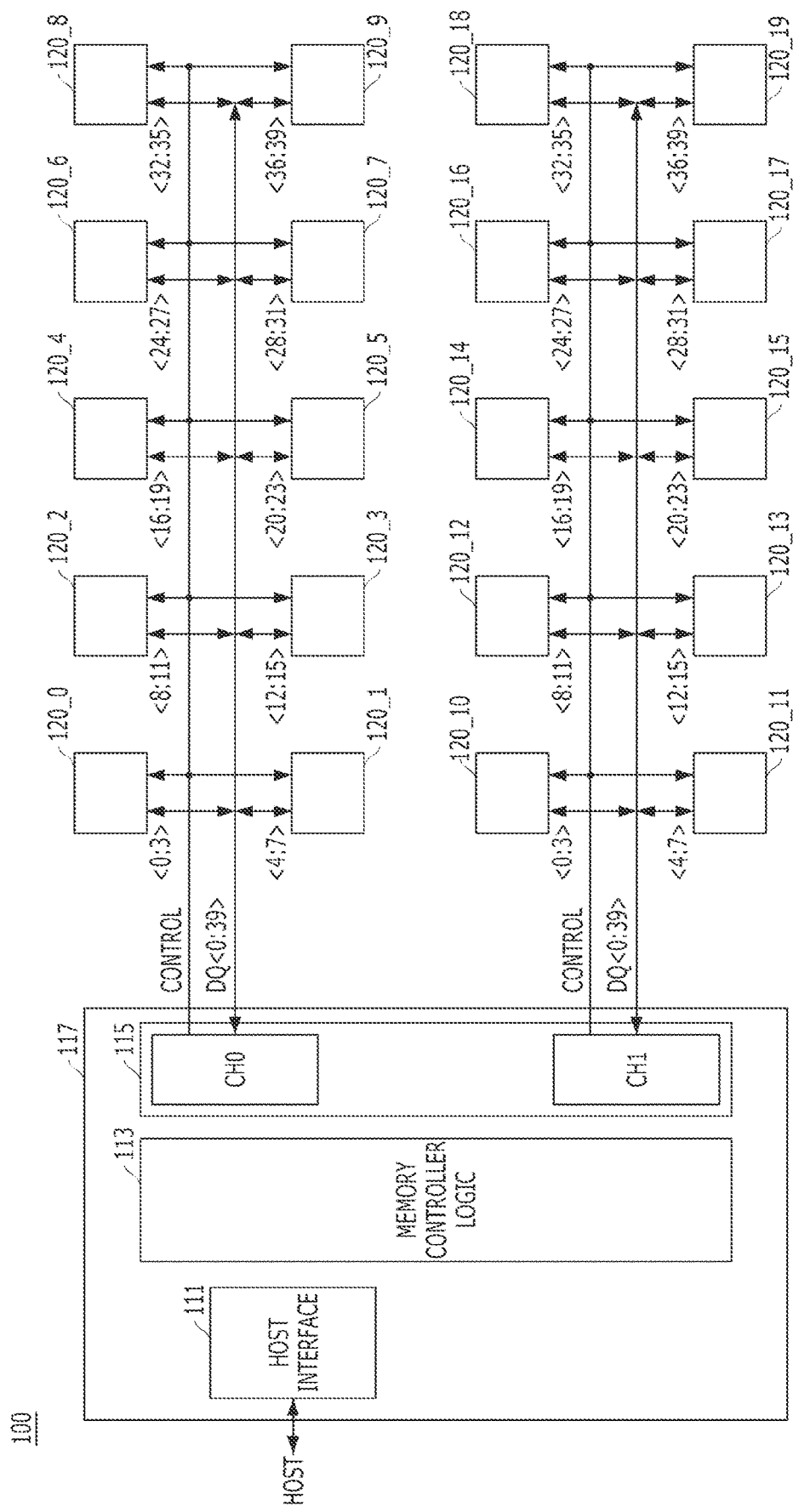
FIG. 1 is a configuration diagram of a memory module 100 in accordance with an embodiment.

FIG. 1 is a configuration diagram of a memory module 100 in accordance with an embodiment.

Referring to FIG. 1, the memory module 100 may include a module controller 110 and memory packages 120_0 to 120_19.

The module controller 110 may include a host interface 111, a memory controller logic 113, and a memory interface 115. The memory controller logic 113 and the memory interface 115 may also be referred to as a memory controller.

The host interface 111 may be used for communication between the module controller 110 and a host HOST (computer system). The host interface 111 may be a compute express link (CXL) interface. The CXL interface may be an interface based on peripheral component interconnect express (PCIe) and may be an interface made so that a central processing unit (CPU), a graphic processing unit (GPU), and various types of accelerators more efficiently use a memory and the like. By connecting the memory module 100 to the host HOST through the CXL interface, the memory capacity of a computer system, such as a data center and a server, can be increased, and various processors in the computer system can share the memory.

The memory controller logic 113 may be a logic for controlling the memory packages 120_0 to 120_19, and the memory interface 115 may be an interface for communicating with the memory packages 120_0 to 120_19. The memory interface 115 may include two channels CH0 and CH1. Ten memory packages 120_0 to 120_9 may be connected to the channel CH0 of the memory interface 115, and ten memory packages 120_10 to 120_19 may be connected to the channel CH1.

The channel CH0 of the memory interface 115 may be connected to the memory packages 120_0 to 120_9 through 40 data lines DQ<0:39>. Four different data lines may be connected to the memory packages 120_0 to 120_9. For example, four data lines DQ<0:3> may be connected to the memory package 120_0, and four data lines DQ<4:7> may be connected to the memory package 120_1.

The channel CH0 of the memory interface 115 may be connected to the memory packages 120_0 to 120_9 through control signal transmission lines CONTROL. The control signal transmission lines CONTROL may include a plurality of lines and may be connected, in common, to the memory packages 120_0 to 120_9. For example, all of the control signal transmission lines CONTROL may be connected to the memory package 120_0 and may also be connected to the memory package 120_1. Although not illustrated in the drawing, lines for transmitting clocks and data strobe signals may be further connected between the channel CH0 of the memory interface 115 and the memory packages 120_0 to 120_9.

The channel CH1 of the memory interface 115 and the memory packages 120_10 to 120_19 may be connected in the same way as the channel CH0 and the memory packages 120_0 to 120_9.

Each of the memory packages 120_0 to 120_19 may include one or more memory chips (for example, DRAM chips). Because one of the important reasons for using the memory module 100 is to greatly increase the capacity of a memory, it may be generally known that each of the memory packages 120_0 to 120_19 includes a plurality of memory chips. Among methods of putting a plurality of memory chips into a memory package, a 3 dimensional stacking (3DS) method has been used. The 3DS method may use a through-silicon via (TSV) for communicating between memory chips in a memory package. However, when a memory package is manufactured in this way, the price of the memory package may increase because a lot of time and cost are required in packaging.

In the memory module 100, in accordance with an embodiment of the present disclosure, each of the memory packages 120_0 to 120_19 may include a buffer chip and a plurality of memory chips. The buffer chip may perform a buffer operation between the module controller 110 and the plurality of memory chips. The plurality of memory chips included in each of the memory packages 120_0 to 120_19 may be connected to the buffer chip through wire bonding. The memory module 100 may increase a memory capacity by using the plurality of memory chips and may reduce loading due to an increase in memory by using a buffer chip.

However, the configuration of the memory packages 120_0 to 120_19 disclosed in the present specification is merely an example and might not be limited thereto. For example, each of the memory packages 120_0 to 120_19 may include different types of memory chips. For example, at least one of the memory packages 120_0 to 120_19 may have a different configuration from other memory packages and/or may be connected to the module controller 110 in a different way. For example, memory chips included in at least one of the memory packages 120_0 to 120_19 may be integrated by using a 3 dimensional stacking (3DS) method, a monolithic 3D (M3D) method, or the like. For example, memory chips included in at least one of the memory packages 120_0 to 120_19 may communicate with each other by using through-silicon vias (TSVs) or vias with a smaller size and higher density than TSVs.

The form factor of the memory module 100 may have various forms, such as an add-in-card (AIC) and an enterprise and data center SSD form factor (EDSFF).

Figure 2:
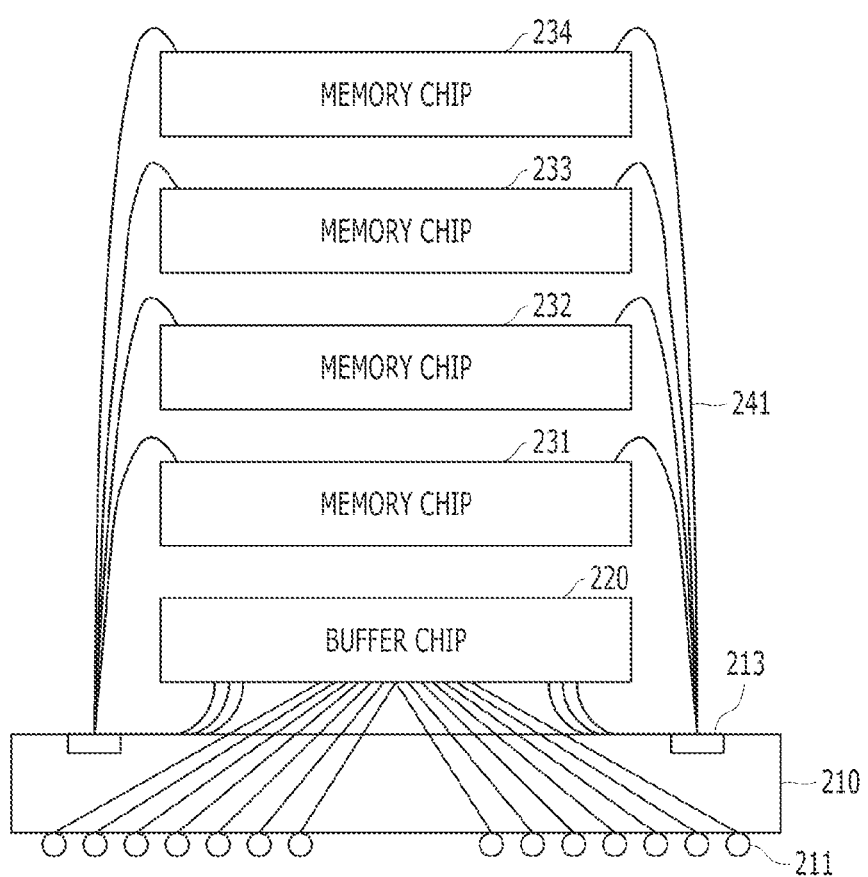
FIG. 2 is a configuration diagram of an embodiment of a memory package 120 in FIG. 1.

FIG. 2 is a configuration diagram of an embodiment of the memory package 120 in FIG. 1.

Referring to FIG. 2, the memory package 120 may include a package substrate 210, a buffer chip 220, and a plurality of memory chips 231 to 234.

The package substrate 210 may include a plurality of package balls 211 that are terminals for communicating with the memory interface 115 (FIG. 1) and a plurality of bonding pads 213 for communicating with memory chips inside the memory package 120.

The buffer chip 220 may be disposed on the package substrate 210. The buffer chip 220 may communicate with the memory interface 115 (FIG. 1) through the package balls 211 of the package substrate 210. The buffer chip 220 may further communicate with the memory chips 231 to 234 through the bonding pads 213 of the package substrate 210.

The memory chips 231 to 234 may be stacked on the buffer chip 220 and may communicate with the buffer chip 220 through wires 241 connecting the bonding pads 213 with the memory chips 231 to 234. The memory chips 231 to 234 may communicate with the memory interface 115 (FIG. 1) through the buffer chip 220. The control signals CONTROL (FIG. 1) and the data DQ<0:39> (FIG. 1) transmitted from the memory interface 115 (FIG. 1) may be transmitted to the buffer chip 220 through the package balls 211, buffered, and then transmitted from the buffer chip 220 to the memory chips 231 to 234 through the bonding pads 213. Data transmitted from the memory chips 231 to 234 may be transmitted to the buffer chip 220 through the bonding pads 213, buffered, and then transmitted to the memory interface 115 (FIG. 1) through the package balls 211.

Because only the buffer chip 220, among the chips of the memory package 120, is connected to the memory interface 115 (FIG. 1), loading between the memory package 120 and the memory interface 115 (FIG. 1) may be reduced to enable a high-speed operation. Because the buffer chip 220 and the memory chips 231 to 234 are connected through wiring instead of a TSV that consumes a lot of cost during the manufacturing process, the manufacturing cost of the memory package 120 may be reduced.

Figure 3:
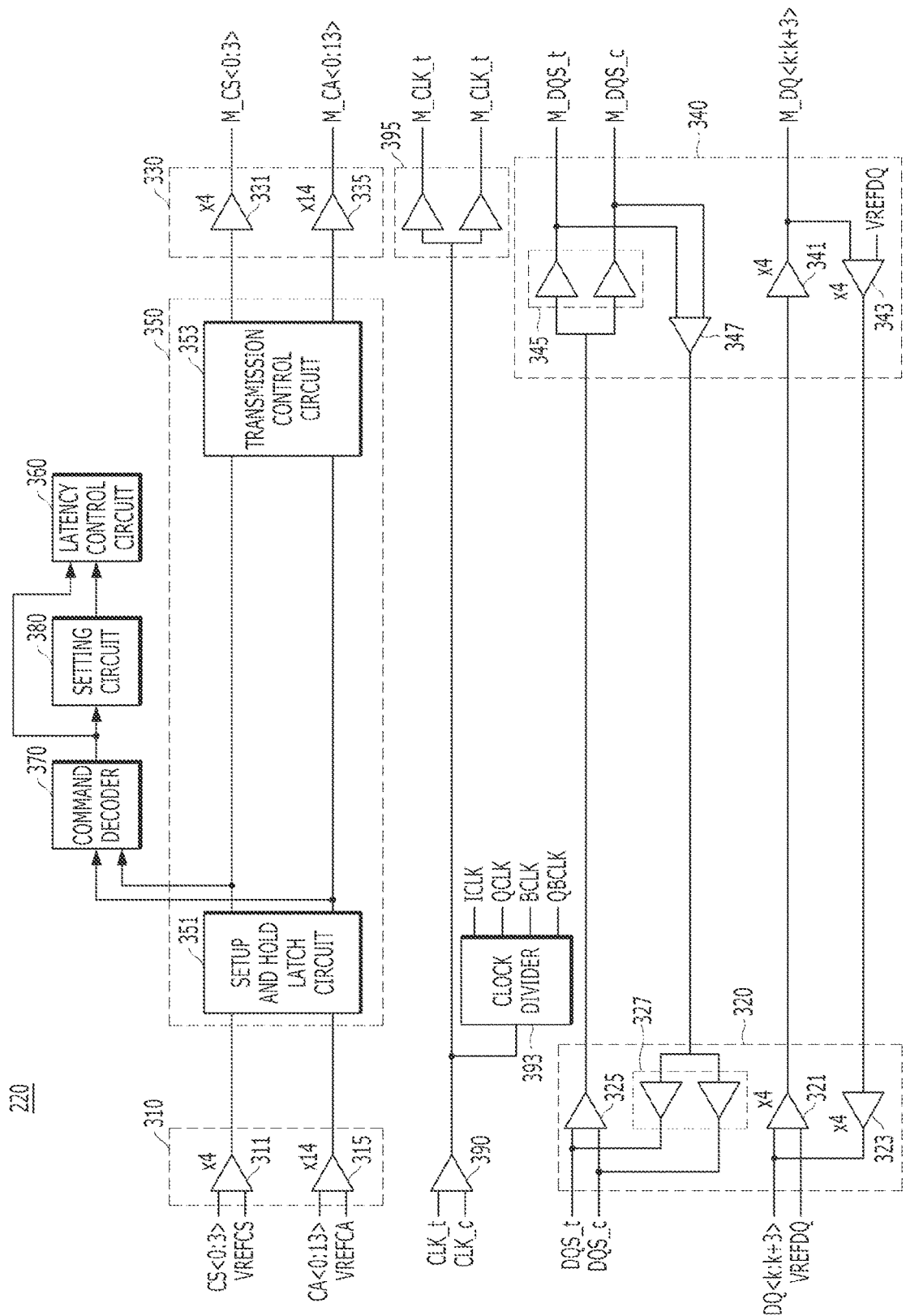
FIG. 3 is a configuration diagram of an embodiment of a buffer chip 220 in FIG. 2.

FIG. 3 is a configuration diagram of an embodiment of the buffer chip 220 in FIG. 2.

Referring to FIG. 3, the buffer chip 220 may include an external control signal interface 310, an external data interface 320, an internal control signal interface 330, an internal data interface 340, a control signal transmission circuit 350, a latency control circuit 360, a command decoder 370, a setting circuit 380, a clock reception circuit 390, a clock divider 393, and a clock transmission circuit 395.

The external control signal interface 310 may receive the control signals CONTROL (FIG. 1) transmitted from the memory interface 115 (FIG. 1). The control signals CONTROL (FIG. 1) may include chip select signals CS<0:3> and command address signals CA<0:13>. The external control signal interface 310 may include a chip select signal reception circuit 311 and a command address reception circuit 315.

The chip select signals CS<0:3> may be used for distinguishing the memory chips 231 to 234 (FIG. 2) in the memory package 120 (FIG. 2), that is, for distinguishing ranks, and the number of chip select signals CS<0:3> may be the same as the number of the memory chips 231 to 234 (FIG. 2) in the memory package 120 (FIG. 2). In FIG. 3, because the number of chip select signals CS<0:3> is illustrated as 4, the chip select signal reception circuit 311 may include four reception buffers. Buffers of the chip select signal reception circuit 311 may receive the chip select signals CS<0:3> by comparing voltage levels of the chip select reference voltage VREFCS with the chip select signals CS<0:3>. However, the number of chip select signals and the number of memory chips are not limited thereto.

The command address reception circuit 315 may include the same number of reception buffers as the number of command address signals CA<0:13>. In FIG. 3, because the number of command address signals CA<0:13> is illustrated as 14, the command address reception circuit 315 may include 14 reception buffers. Buffers of the command address reception circuit 315 may receive the command address signals CA<0:13> by comparing voltage levels of a command address reference voltage VREFCA with the command address signals CA<0:13>. However, the number of command address signals and the number of reception buffers are not limited thereto.

The external data interface 320 may transmit/receive data DQ<k:k+3> (K is an integer equal to or greater than 0) to/from the memory interface 115 (FIG. 1). The external data interface 320 may transmit/receive not only the data DQ<k:k+3> but also data strobe signals DQS_t and DQS_c for strobing the data DQ<k:k+3>. The external data interface 320 may include an external data reception circuit 321, an external data transmission circuit 323, an external data strobe reception circuit 325, and an external data strobe transmission circuit 327.

The external data reception circuit 321 may include the same number of reception buffers as the number of terminals to which the data DQ<k:k+3> are input. In FIG. 3, because four data terminals are provided for each memory package 120 (FIG. 2), the external data reception circuit 321 may include four reception buffers. Buffers of the external data reception circuit 321 may receive the data DQ<k:k+3> by comparing voltage levels of the data reference voltage VREFDQ with the data DQ<k:k+3>. However, the number of terminals and the number of reception buffers are not limited thereto.

The external data strobe reception circuit 325 may receive the data strobe signals DQS_t and DQS_c transmitted from the memory interface 115 (FIG. 1) as the data DQ<k:k+3> is received by the external data reception circuit 321. Because the data strobe signals DQS_t and DQS_c are differential-type signals, the external data strobe reception circuit 325 may include a reception buffer that compares voltage levels of a positive data strobe signal DQS_t with a negative data strobe signal DQS_c.

The external data transmission circuit 323 may transmit the data DQ<k:k+3>. The external data transmission circuit 323 may include four transmission drivers.

The external data strobe transmission circuit 327 may transmit the data strobe signals DQS_t and DQS_c for strobing the data DQ<k:k+3> transmitted by the external data transmission circuit 323. The external data strobe transmission circuit 327 may include two transmission drivers.

The clock reception circuit 390 may receive clocks CLK_t and CLK_c transmitted from the memory interface 115 (FIG. 1). Because the clocks CLK_t and CLK_c are differential-type signals, the clock reception circuit 390 may include a reception buffer that compares voltage levels of the regular clock CLK_t with the secondary clock CLK_c.

The clock divider 393 may divide the clocks CLK_t and CLK_c received by the clock reception circuit 390. First to fourth clocks ICLK, QCLK, BCLK, and QBCLK generated by the clock divider 393 may each have a frequency of half the frequency of each of the clocks CLK_t and CLK_c and may have different phases. The clocks CLK_t and CLK_c received by the clock reception circuit 390 and the first to fourth clocks ICLK, QCLK, BCLK, and QBCLK generated by the clock divider 393 may be used by various components inside the buffer chip 220.

The control signal transmission circuit 350 may buffer the control signals received through the external control signal interface 310 and may transmit the buffered control signals to the internal control signal interface 330. The control signal transmission circuit 350 may include a setup and hold latch circuit 351 for securing a setup hold margin and a transmission control circuit 353 for performing a buffering operation.

The internal control signal interface 330 may transmit control signals M_CS<0:3> and M_CA<0:13> transmitted through the control signal transmission circuit 350 to the memory chips 231 to 234 (FIG. 2). The command address signals M_CA<0:13> may be transmitted in common to the memory chips 231 to 234 (FIG. 2), and the chip select signals M_CS<0:3> may be transmitted to the memory chips 231 to 234 (FIG. 2) in a one-to-one manner. That is, the chip select signal M_CS<0> may be transmitted to the memory chip 231 (FIG. 2), the chip select signal M_CS<1> may be transmitted to the memory chip 232 (FIG. 2), the chip select signal M_CS<2> may be transmitted to the memory chip 233 (FIG. 2), and the chip select signal M_CS<3> may be transmitted to the memory chip 234 (FIG. 2).

The internal control signal interface 330 may include a chip select signal transmission circuit 331 and a command address transmission circuit 335. Because the number of chip select signals M_CS<0:3> is 4, the chip select signal transmission circuit 331 may include four transmission drivers. Also, because the number of command address signals M_CA<0:13> is 14, the command address transmission circuit 335 may include 14 transmission drivers.

The internal data interface 340 may transmit/receive data M_DQ<k:k+3> to/from the memory chips 231 to 234 (FIG. 2). The data M_DQ<k:k+3> may be connected in common to the memory chips 231 to 234 (FIG. 2). When the data M_DQ<k:k+3> is transmitted in common to the memory chips 231 to 234 (FIG. 2) during a write operation, a memory chip selected to perform a write operation, among the memory chips 231 to 234 (FIG. 2), may receive the data M_DQ<k:k+3> transmitted by the internal data interface 340. During a read operation, a memory chip selected to perform a read operation, among the memory chips 231 to 234, may transmit the data M_DQ<k:k+3> to the internal data interface 340. The internal data interface 340 may transmit/receive not only the data M_DQ<k:k+3> but also the data strobe signals M_DQS_t and M_DQS_c for strobing the data M_DQ<k:k+3> to/from the memory chips 231 to 234 (FIG. 2).

The internal data interface 340 may include an internal data transmission circuit 341, an internal data reception circuit 343, an internal data strobe transmission circuit 345, and an internal data strobe reception circuit 347. The internal data transmission circuit 341 may include four transmission drivers, and the internal data reception circuit 343 may include four reception buffers. The internal data strobe transmission circuit 345 may include two transmission drivers, and the internal data strobe receive circuit 347 may include one reception buffer.

The clock transmission circuit 395 may transmit the clocks M_CLK_t and M_CLK_c to the memory chips 231 to 234 (FIG. 2). The clocks M_CLK_t and M_CLK_c may be transmitted in common to the memory chips 231 to 234 (FIG. 2). The clock transmission circuit 395 may include two transmission drivers.

The command decoder 370 may decode the chip select signals CS<0:3> and the command address signals CA<0:13> received through the external control signal interface 310. The command decoder 370 may receive and decode control signals latched by the setup and hold latch circuit 351 after being received by the external control signal interface 310. The chip select signals CS<0:3> may indicate the validity of the command address signals CA<0:13>, and when even one of the four chip select signals CS<0:3> is activated to a low level, the command decoder 370 of the buffer chip 220 may determine that the command address signals CA<0:13> are valid and may decode the command address signals CA<0:13>.

The setting circuit 380 may perform a setting operation according to the decoding result of the command decoder 370. Setting items of the setting circuit 380 may include a read latency of the buffer chip 220, a write latency of the buffer chip 220, levels of reference voltages used by the buffer chip 220, a termination resistance value (also referred to as Rtt) of the buffers of the buffer chip 220, a termination resistance value (also referred to as Ron) of the drivers of the buffer chip 220, an equalizing coefficient (for example, a coefficient of decision feedback equalization) of the buffer chip 220, a command rate, and the like.

The latency control circuit 360 may control whether to activate the external data interface 320 and the internal data interface 340. The latency control circuit 360 may activate the external data reception circuit 321 and the internal data transmission circuit 341 so that the data DQ<k:k+3> transmitted from the memory interface 115 (FIG. 1) to the buffer chip 220 may be received after a write latency set by the setting circuit 380 from the time point at which a write command is applied to the buffer chip 220 and transmitted to the memory chips 231 to 234 (FIG. 2). The latency control circuit 360 may further activate the internal data reception circuit 343 and the external data transmission circuit 323 so that data DQ<k:k+3> buffered after being received from the memory chips 231 to 234 (FIG. 2) may be transmitted from the buffer chip 220 to the memory interface 115 (FIG. 1) after a read latency set by the setting circuit 380 from the time point at which a read command is applied to the buffer chip 220. The latency control circuit 360 may activate the external data strobe reception circuit 325 and the internal data strobe transmission circuit 345 during the write operation and may activate the internal data strobe reception circuit 347 and the external data strobe transmission circuit 327 during the read operation so that the data strobe signals DQS_t and DQS_c may also be transmitted and received together with the data DQ<k:k+3>. The latency control circuit 360 may receive information indicating that the read command and the write command have been applied to the buffer chip 220 from the command decoder 370 and may receive information related to the read latency and the write latency from the setting circuit 380.

Figure 4:
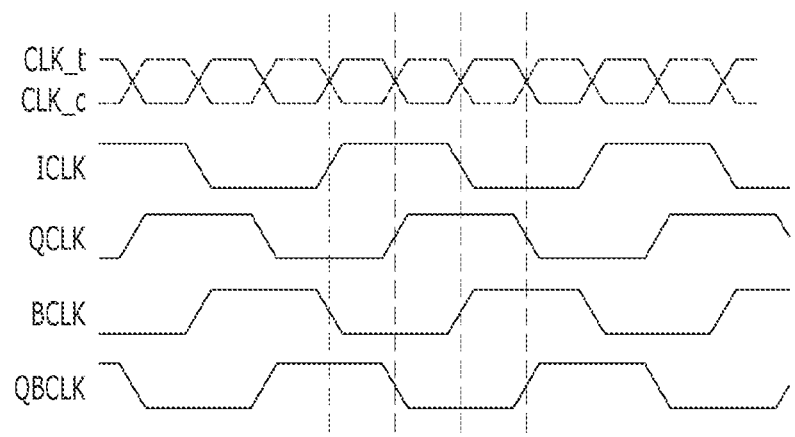
FIG. 4 is a diagram illustrating first to fourth clocks ICLK, QCLK, BCLK, and QBCLK generated by a clock divider 390 in FIG. 3.

FIG. 4 is a diagram illustrating the first to fourth clocks ICLK, QCLK, BCLK, and QBCLK generated by the clock divider 393 in FIG. 3.

Referring to FIG. 4, the first to fourth clocks ICLK, QCLK, BCLK, and QBCLK generated by the clock divider 393 may each have a frequency of half the frequency of each of the clocks CLK_t and CLK_c. Furthermore, each of the first to fourth clocks ICLK, QCLK, BCLK, and QBCLK may have a phase difference of 90° in comparison to a preceding or subsequent clock (i.e., a phase difference between the second clock QCLK and the third clock BCLK, between the fourth clock QBCLK and the first clock ICLK, etc.).

Figure 5:
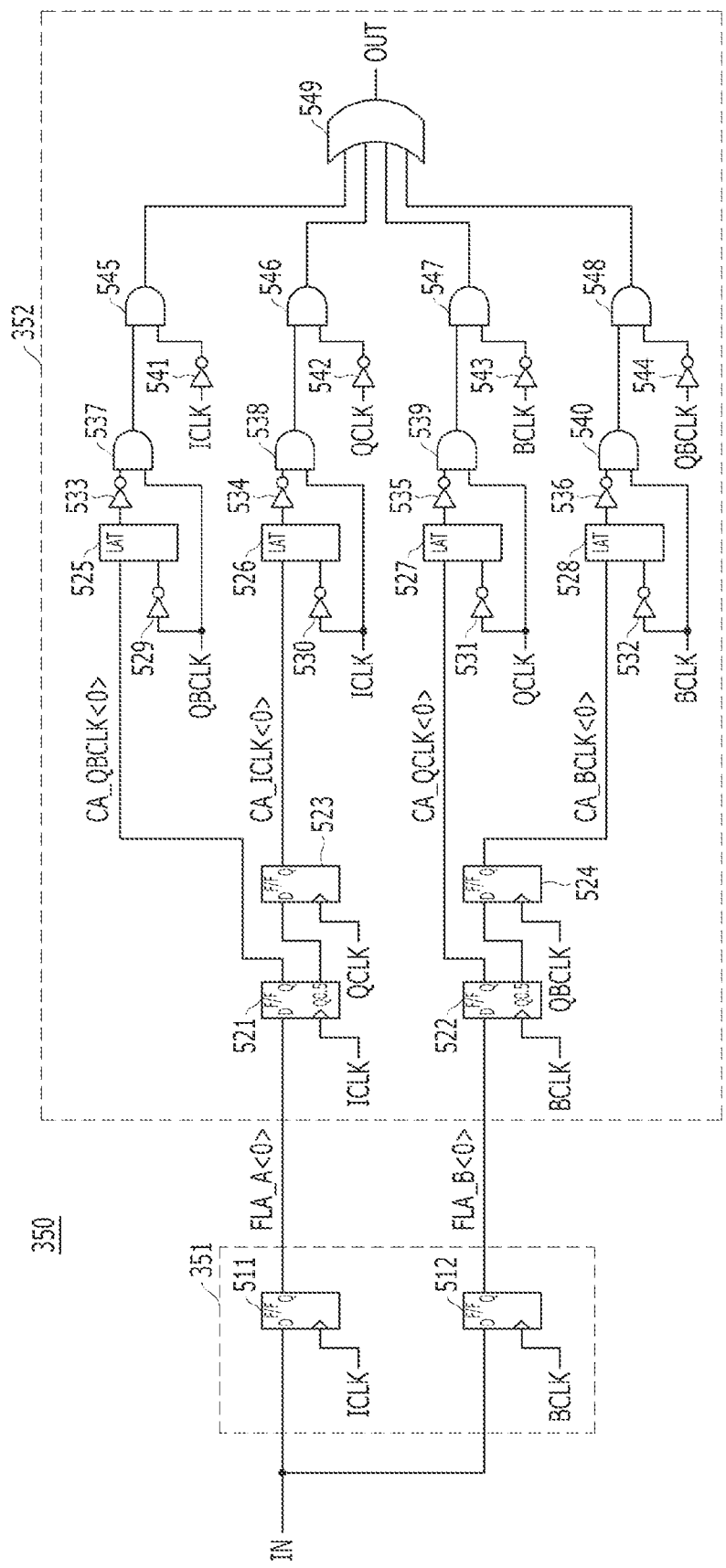
FIG. 5 is a configuration diagram of an embodiment of a control signal transmission circuit 350 in FIG. 3.
Figure 6:
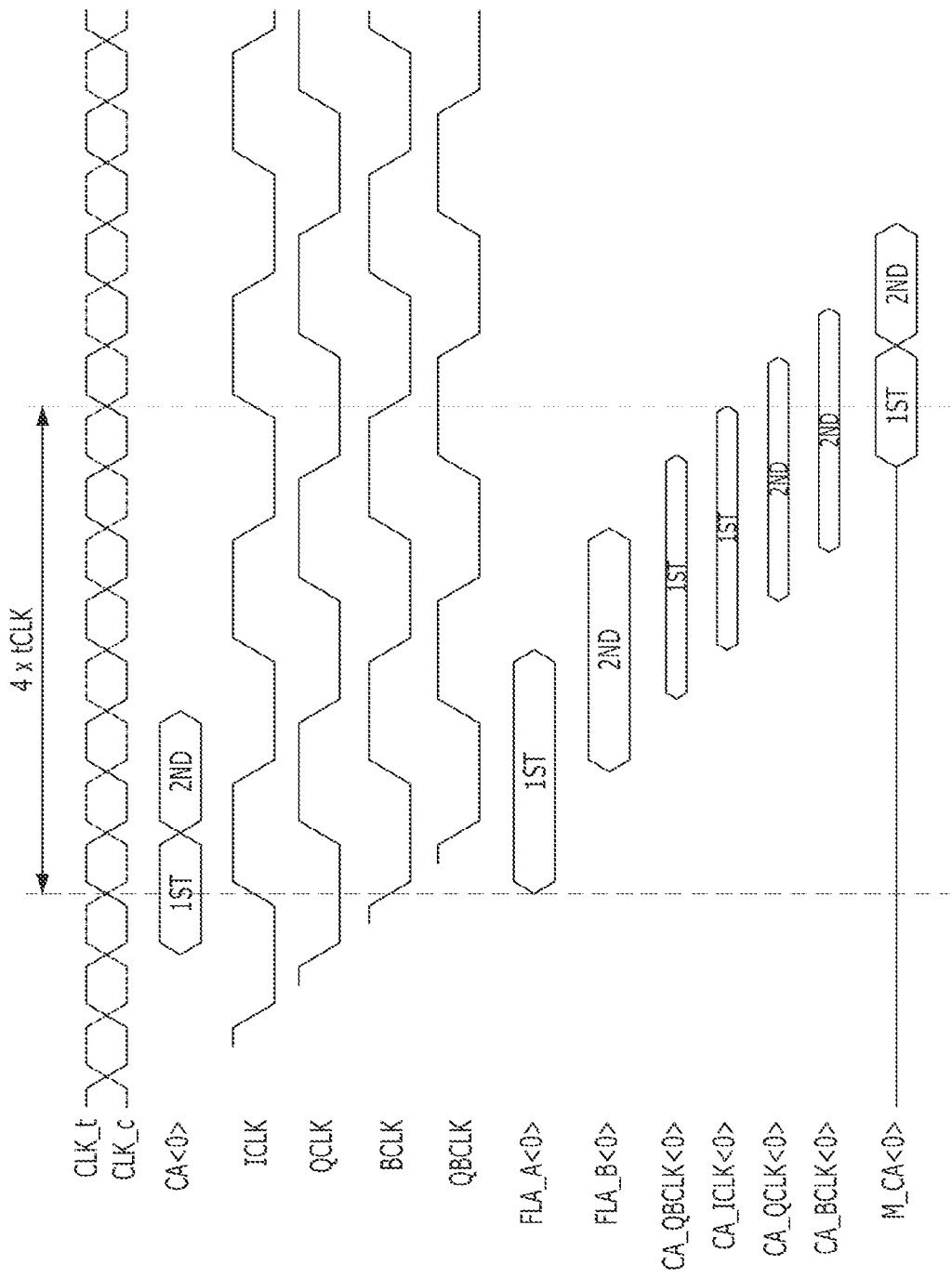
FIG. 6 is an operation timing diagram of the control signal transmission circuit 350 in FIG. 5.

FIG. 5 is a configuration diagram of an embodiment of the control signal transmission circuit 350 in FIG. 3, and FIG. 6 is an operation timing diagram of the control signal transmission circuit 350. FIG. 5 illustrates components for transmitting the command address signal CA<0> in the control signal transmission circuit 350. The remaining control signals CA<1:13> and CS<0:3> may also be transmitted in the same way as the command address signal CA<0>.

Referring to FIG. 5, the setup and hold latch circuit 351 of the control signal transmission circuit 350 may include D flip-flops 511 and 512. An input IN of the D flip-flops 511 and 512 may be an output of a buffer of the command address reception circuit 315 in FIG. 3, which receives the command address signal CA<0>. The D flip-flop 511 may receive an input at a rising edge of a first clock ICLK, latch the received input, and output a signal FLA_A<0>. On the other hand, the D flip-flop 512 may receive an input at a rising edge of a third clock BCLK, latch the received input, and output a signal FLA_B<0>. Referring to FIGS. 5 and 6, a signal 1ST, which is a first cycle of the command address signal CA<0> may be latched by the D flip-flop 511 and may be output as the signal FLA_A<0>, and a signal 2ND, which is a second cycle of the command address signal CA<0> may be latched by the D flip-flop 512 and may be output as the signal FLA_B<0>.

The transmission control circuit 352 of the control signal transmission circuit 350 may include D flip-flops 521 to 524, D latches 525 to 528, inverters 529 to 536 and 541 to 544, AND gates 537 to 540 and 545 to 548, and an OR gate 549.

Figure 7:
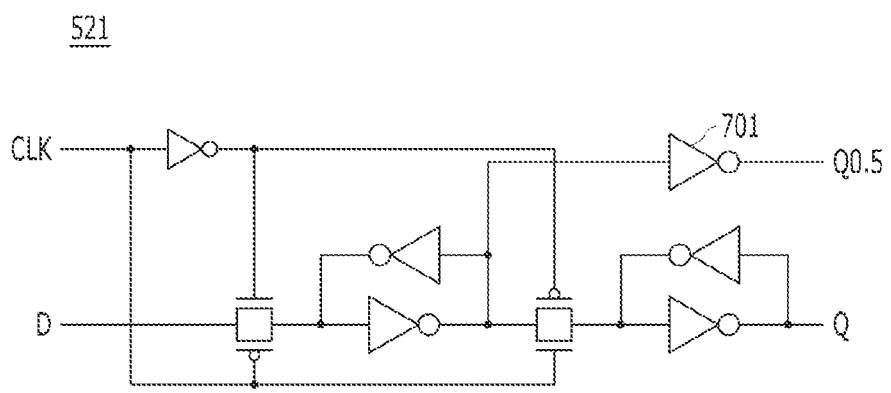
FIG. 7 is a diagram illustrating an internal configuration of a D flip-flop 521.

The D flip-flop 521 may receive and latch the signal FLA_A<0> at the rising edge of the first clock ICLK. A signal output as an output Q of the D flip-flop 521 may be indicated by CA_QBCLK<0>. An output Q0.5 of the D flip-flop 521 may be an output of a first stage of the D flip-flop 521 including two stages. FIG. 7 illustrates the internal configuration of the D flip-flop 521, and the D flip-flop 521 may further include an inverter 701 for outputting the output Q0.5 from a latch of the first stage in addition to the configuration of a general D flip-flop. The D flip-flop 523 may receive and latch the output Q0.5 of the D flip-flop 521 at a rising edge of the second clock QCLK and may output the latched output as a signal CA_ICLK<0>. Referring to FIG. 6, the phases of the signals CA_QBCLK<0> and CA_ICLK<0> may correspond to the phases of the first clock ICLK and the second clock QCLK and may have the same phase differences.

The D flip-flop 522 may receive and latch the signal FLA_B<0> at the rising edge of the third clock BCLK. A signal output as an output Q of the D flip-flop 522 may be indicated by CA_QCLK<0>. The D flip-flop 524 may receive and latch an output Q0.5 of the D flip-flop 522 at a rising edge of the fourth clock QBCLK and may output the latched output as a signal CA_BCLK<0>. Referring to FIG. 6, the phases of the signals CA_QCLK<0> and CA_BCLK<0> may correspond to the phases of the third clock BCLK and the fourth clock QBCLK and may have the same phase differences.

The D latch 525 may latch and output the signal CA_QBCLK<0> while the fourth clock QBCLK is at a low level, an output of the D latch 525 may be inverted by the inverter 533, and an output of the inverter 533 and the fourth clock QBCLK may be input to the AND gate 537. An output of the AND gate 537 may be input to the AND gate 545 together with the first clock ICLK inverted by the inverter 541.

The D latch 526 may latch and output the signal CA_ICLK<0> while the first clock ICLK is at a low level, an output of the D latch 526 may be inverted by the inverter 534, and an output of the inverter 534 and the first clock ICLK may be input to the AND gate 538. An output of the AND gate 538 may be input to the AND gate 546 together with the second clock QCLK inverted by the inverter 542.

The D latch 527 may latch and output the signal CA_QCLK<0> while the second clock QCLK is at a low level, an output of the D latch 527 may be inverted by the inverter 535, and an output of the inverter 535 and the second clock QCLK may be input to the AND gate 539. An output of the AND gate 539 may be input to the AND gate 547 together with the third clock BCLK inverted by the inverter 543.

The D latch 528 may latch and output the signal CA_BCLK<0> while the third clock BCLK is at a low level, an output of the D latch 528 may be inverted by the inverter 536, and an output of the inverter 536 and the third clock BCLK may be input to the AND gate 540. An output of the AND gate 540 may be input to the AND gate 548 together with the fourth clock QBCLK inverted by the inverter 544.

Outputs of the AND gates 545 to 548 may be input to the OR gate 549, and an output OUT of the OR gate 549 may be an input of a driver of the command address transmission circuit 335 in FIG. 3, which transmits the command address signal M_CA<0>.

Referring to FIG. 6, the command address signal CA<0> received from the memory interface 115 (FIG. 1) by the command address reception circuit 315 of the buffer chip 220 may be buffered by the control signal transmission circuit 350, delayed by 4 clock cycles based on the clocks CLK_t and CLK_c, and transmitted to the memory chips 231 to 234 (FIG. 2) by the command address transmission circuit 335.

Referring now back to FIG. 3, a path through which the control signals CS<0:3> and CA<0:13> are transmitted from the memory controller to the memory chips 231 to 234 may include the external control signal interface 310, the latency control circuit 360, and the internal control signal interface 330, and a path through which the data DQ<k:k+3> are transmitted from the memory chips 231 to 234 to the memory controller may include the internal data interface 340 and the external data interface 320. When the memory controller commands a read operation to the memory chips 231 to 234, the control signals CS<0:3> and CA<0:13> may be transmitted via the external control signal interface 310, the latency control circuit 360, and the internal control signal interface 330 of the buffer chip 220, and in response to the transmission of the control signals CS<0:3> and CA<0:13>, the read data DQ<k:k+3> may be transmitted from the memory chips 231 to 234 to the memory controller via the internal data interface 340 and the external data interface 320. The latency control circuit 360 may have delay values synchronized with the clocks CLK_t and CLK_c transmitted from the memory controller, but the external control signal interface 310, the internal control signal interface 330, the internal data interface 340, and the external data interface 320 may inevitably include an unintended asynchronous delay. The existence of such an asynchronous delay may inevitably become a burden on the memory controller, but the asynchronous delay can be overcome by a training operation. However, what can be overcome by the training operation of the memory controller is a case in which the buffer chip 220 has a constant asynchronous delay value, and when the asynchronous delay value is changed according to changes in the temperature and voltage of the buffer chip 220, various operations may inevitably fail due to the asynchronous delay. Accordingly, a technique capable of constantly maintaining an asynchronous delay value of the buffer chip 220 is required.

Figure 8:
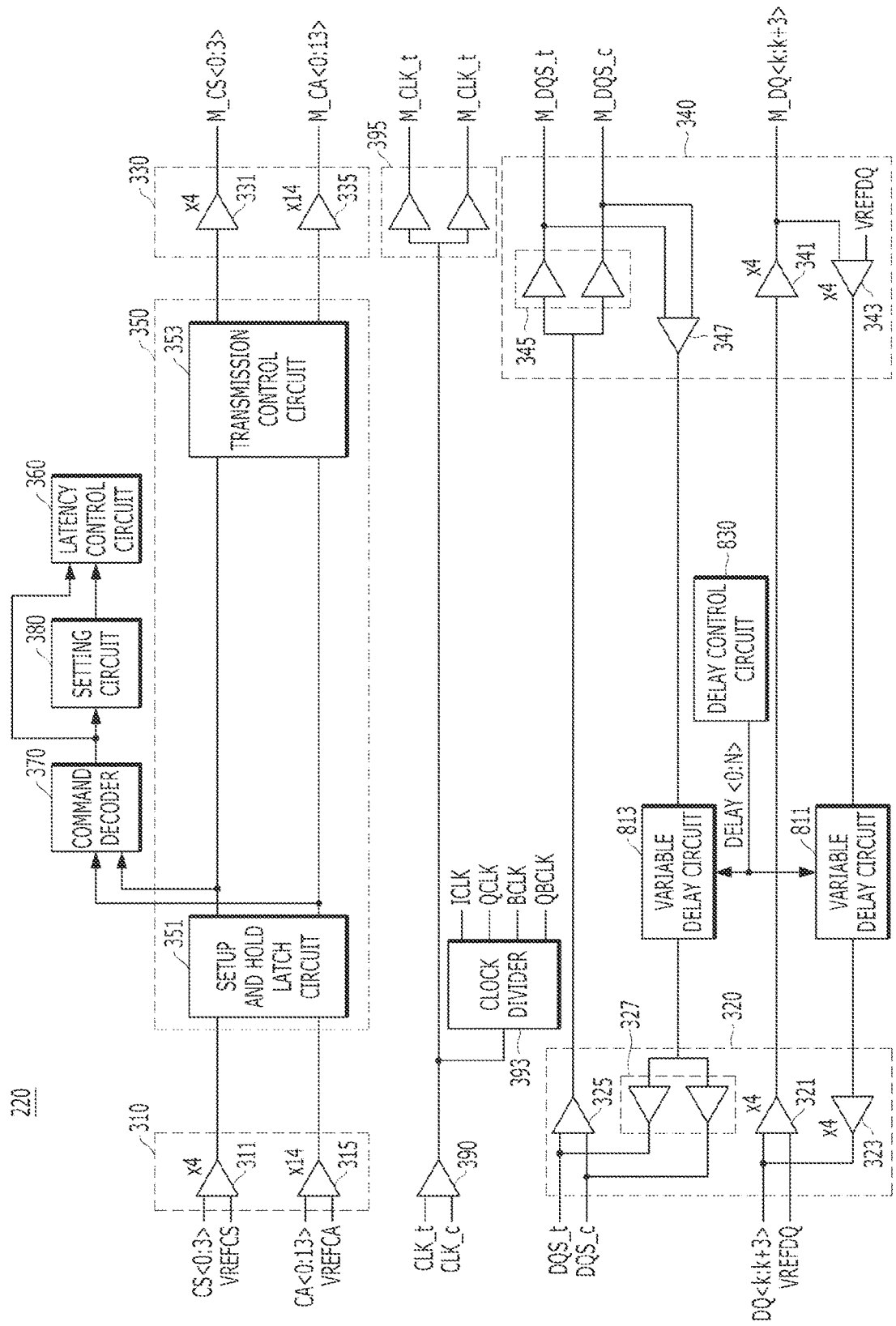
FIG. 8 is a configuration diagram of another embodiment of the buffer chip 220 in FIG. 2.

FIG. 8 is a configuration diagram of another embodiment of the buffer chip 220 in FIG. 2. With reference to FIG. 8, an embodiment will be described capable of constantly maintaining an asynchronous delay of the buffer chip 220.

Referring to FIG. 8, the buffer chip 220 may include the external control signal interface 310, the external data interface 320, the internal control signal interface 330, the internal data interface 340, the control signal transmission circuit 350, the latency control circuit 360, the command decoder 370, the setting circuit 380, the clock reception circuit 390, the clock divider 393, the clock transmission circuit 395, variable delay circuits 811 and 813, and a delay control circuit 830.

A first variable delay circuit 811 may have a delay value adjusted by a delay code DELAY<0:N> and may delay the data M_DQ<k:k+3> received by the internal data reception circuit 343 and may transmit the delayed data M_DQ<k:k+3> to the external data transmission circuit 323. The first variable delay circuit 811 may be used to constantly maintain asynchronous delay values of a control signal transmission path through which the control signals CS<0:3> and CA<0:13> transmitted from the memory controller are transmitted to the memory chips 231 to 234 through the buffer chip 220. The first variable delay circuit 811 may also be used to constantly maintain asynchronous delay values of a data transmission path through which the data M_DQ<k:k+3> transmitted from one of the memory chips 231 to 234 are transmitted to the memory controller through the buffer chip 220. In the control signal transmission path, an asynchronous delay may occur in the chip select signal reception circuit 311, the command address reception circuit 315, the chip select signal transmission circuit 331, and the command address transmission circuit 335. Furthermore, in the data transmission path, an asynchronous delay may occur in the internal data reception circuit 343 and the external data transmission circuit 323. The first variable delay circuit 811 may compensate for changes in such an asynchronous delay.

A second variable delay circuit 813 may delay the data strobe signals M_DQS_t and M_DQS_c received by the internal data strobe reception circuit 343 and may transmit the delayed data strobe signals M_DQS_t and M_DQS_c to the external data strobe transmitting circuit 327. The second variable delay circuit 813 may have a delay value adjusted by the same delay code DELAY<0:N> as that of the first variable delay circuit 813, the delay value being identical to the delay value of the first variable delay circuit 811. Because the data strobe signals M_DQS_t and M_DQS_c are signals for strobing the data M_DQ<k:k+3>, the data strobe signals M_DQS_t and M_DQS_c may be delayed the same as the data M_DQ<k:k+3> by the second variable delay circuit 813.

The delay control circuit 830 may generate the delay code DELAY<0:N>. The delay control circuit 830 may generate the delay code DELAY<0:N> so that the delay value of the first variable delay circuit 811 may be decreased when the asynchronous delay values of the control signal transmission path and the data transmission path are increased and may be increased when the asynchronous delay values of the control signal transmission path and the data transmission path are decreased. That is, the delay control circuit 830 may generate the delay code DELAY<0:N> so that the asynchronous delay value of the buffer chip 220 may always maintain a constant value.

Figure 9:
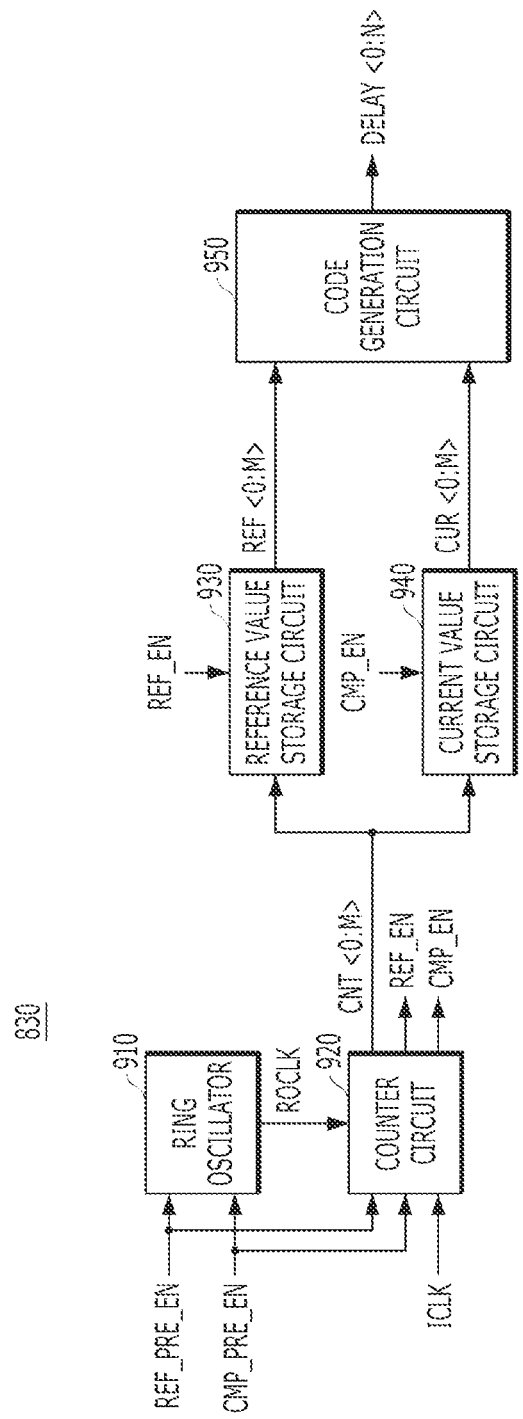
FIG. 9 is a configuration diagram of an embodiment of a delay control circuit 830 in FIG. 8.

FIG. 9 is a configuration diagram of an embodiment of the delay control circuit 830 in FIG. 8.

Referring to FIG. 9, the delay control circuit 830 may include a ring oscillator 910, a counter circuit 920, a reference value storage circuit 930, a current value storage circuit 940, and a code generation circuit 950.

Figure 10:
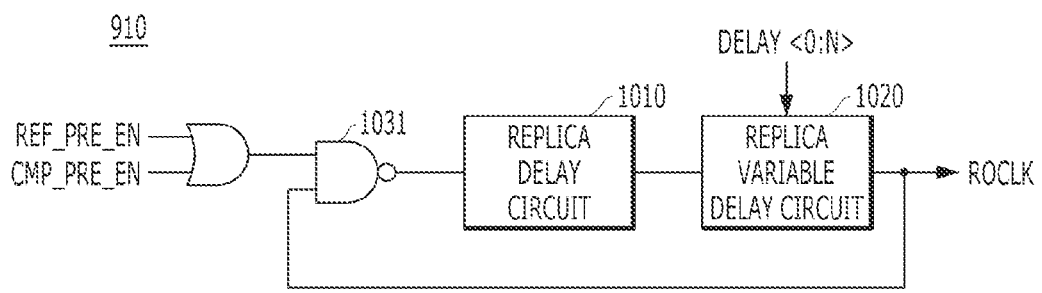
FIG. 10 is a configuration diagram of an embodiment of a ring oscillator 910.

The ring oscillator 910 may generate a ring oscillator clock ROCLK. The frequency of the ring oscillator clock ROCLK may be changed according to changes in the temperature and voltage of the buffer chip 220. FIG. 10 is a configuration diagram of an embodiment of the ring oscillator 910. Referring to FIG. 10, the ring oscillator 910 may include a replica delay circuit 1010, a replica variable delay circuit 1020, a NAND gate 1031, and an OR gate 1033. When one of a preliminary reference setting signal REF_PRE_EN and a preliminary comparison signal CMP_PRE_EN is activated to a high level, the OR gate 1033 may activate a ring oscillator activation signal RO_EN to a high level. When the ring oscillator activation signal RO_EN input to the NAND gate 1031 is activated to a high level, the ring oscillator clock ROCLK may toggle, and when the ring oscillator activation signal RO_EN is deactivated to a low level, the ring oscillator clock ROCLK may be deactivated without toggling. The frequency of the ring oscillator clock ROCLK generated by the ring oscillator 910 may be determined by a delay value of the ring oscillator 910. The replica delay circuit 1010 is a circuit that replicates the asynchronous delay values of the control signal transmission path and the data transmission path, and the replica variable delay circuit 1020 may be a circuit that replicates the delay value of the first variable delay circuit 811. Accordingly, when the asynchronous delay value of the buffer chip 220 is changed due to changes in the temperature and voltage of the buffer chip 220, the frequency of the ring oscillator clock ROCLK may also be changed.

The counter circuit 920 may count the number of toggles of the ring oscillator clock ROCLK while an external clock ICLK input from a device external to the buffer chip 220 toggles a reference number of times. For example, the counting circuit 920 may count how many times the ring oscillator clock ROCLK toggles while the external clock ICLK toggles 1000 times. A counting code CNT<0:M> may be a counting result of the counter circuit 920. In the present embodiment, the clock ICLK generated by the clock divider 393 may be used as the external clock ICLK. However, as the external clock ICLK is used by the counter circuit 920, the externally inputted clocks CLK_t and CLK_c and one of the other clocks QCLK, BCLK, and QBCLK generated using the clocks CLK_t and CLK_c may also be used as well as the clock ICLK.

The counter circuit 920 may operate when the preliminary reference setting signal REF_PRE_EN is activated and when the preliminary comparison signal CMP_PRE_EN is activated. The counter circuit 920 may start a counting operation in response to the activation of the preliminary reference setting signal REF_PRE_EN and may activate a reference setting signal REF_EN when the counting operation is terminated. The preliminary reference setting signal REF_PRE_EN may be a signal for activating the counting operation of the counter circuit 920 for generating a reference value. The counter circuit 920 may start the counting operation in response to activation of the preliminary comparison signal CMP_PRE_EN and may activate the comparison signal CMP_EN when the counting operation is terminated. The preliminary comparison signal CMP_PRE_EN may be a signal for activating the counting operation of the counter circuit 920 for generating a current value.

The reference value storage circuit 930 may store the counting code CNT<0:M> generated by the counter circuit 920 as a reference value REF<0:M> in response to the activation of the reference setting signal REF_EN. The reference value REF<0:M> may be a value representing the standard of the asynchronous delay value of the buffer chip 220 and may need to be set again during an initialization operation of the buffer chip 220 and whenever the buffer chip 220 is newly set. Accordingly, the preliminary reference setting signal REF_PRE_EN for setting the reference value REF<0:M> may be activated during a read training operation, when a self-refresh mode is terminated, and during a ZQ calibration operation.

The current value storage circuit 940 may store the counting code CNT<0:M> generated by the counter circuit 920 as a current value CUR<0:M> in response to the activation of the comparison signal CMP_EN. The current value CUR<0:M> may be a value used for updating the delay code DELAY<0:N> and may be a value that needs to be continuously updated. Accordingly, the preliminary comparison signal CMP_PRE_EN for setting the current value CUR<0:M> may be periodically activated within an operation period of the buffer chip 220.

The code generation circuit 950 may generate the delay code DELAY<0:N> by comparing the reference value REF<0:M> with the current value CUR<0:M>. When the current value CUR<0:M> is smaller than the reference value REF<0:M>, which indicates that the asynchronous delay value of the buffer chip 220 has increased, the code generation circuit 950 may decrease the delay values of the variable delay circuits 811 and 813 by decreasing the value of the delay code DELAY<0:N>. When the current value CUR<0:M> is greater than the reference value REF<0:M>, which indicates that the asynchronous delay value of the buffer chip 220 has decreased, the code generation circuit 950 may increase the delay values of the variable delay circuits 811 and 813 by increasing the value of the delay code DELAY<0:N>.

Figure 11:
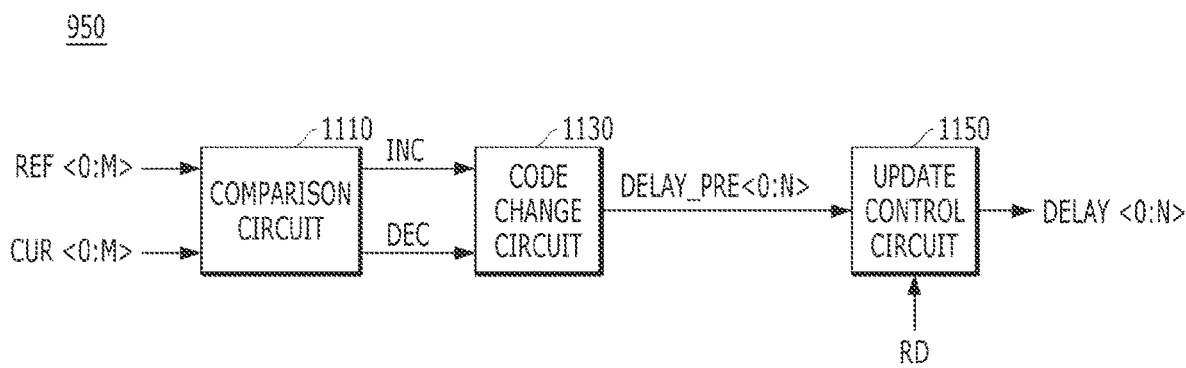
FIG. 11 is a configuration diagram of an embodiment of a code generation circuit 950 in FIG. 9.

FIG. 11 is a configuration diagram of an embodiment of the code generation circuit 950 in FIG. 9.

Referring to FIG. 11, a code generation circuit 950 may include a comparison circuit 1110, a code change circuit 1130, and an update control circuit 1150.

The comparison circuit 1110 may generate an increase signal INC and a decrease signal DEC by comparing the reference value REF<0:M> with the current value CUR<0:M>. When the current value CUR<0:M> is greater than the reference value REF<0:M>, the comparison circuit 1110 may activate the increase signal INC. When the current value CUR<0:M> is smaller than the reference value REF<0:M>, the comparison circuit 1110 may activate the decrease signal DEC.

The code change circuit 1130 may increase the value of the preliminary delay code DELAY_PRE<0:N> when the increase signal INC is activated and may decrease the value of the preliminary delay code DELAY_PRE<0:N> when the decrease signal DEC is activated.

The update control circuit 1150 may prevent the preliminary delay code DELAY_PRE<0:N> generated by the code change circuit 1130 from being updated to the delay code DELAY<0:N> in a read operation period and may update the preliminary delay code DELAY_PRE<0:N> to the delay code DELAY<0:N> during a period other than the read operation period. A read signal RD may be a signal that is activated in the read operation period. The preliminary delay code DELAY_PRE<0:N> and the delay code DELAY<0:N> may have the same value in a period in which the read signal RD is deactivated, and the preliminary delay code DELAY_PRE<0:N> might not be updated to the delay code DELAY<0:N> and the delay code DELAY<0:N> may maintain the same value as before in a period in which the read signal RD is activated. This may be to prevent an abnormal operation that may occur when the delay values of the variable delay circuits 811 and 813 are changed during the read operation, that is, during an operation in which the variable delay circuits 811 and 813 delay the data M_DQ<k:k+3> and the data strobe signals M_DQS_t and M_DQS_c. According to the embodiment, the update control circuit 1150 may be omitted from the code generation circuit 950, and a code generated by the code change circuit 1130 may be directly transmitted to the variable delay circuits 811 and 813.

Figure 12:
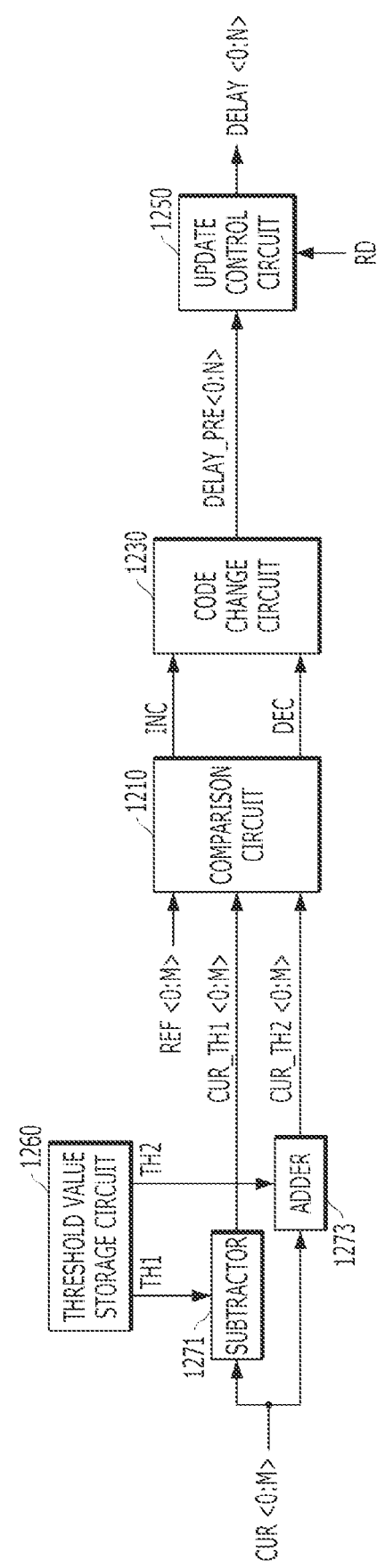
FIG. 12 is a configuration diagram of another embodiment of the code generation circuit 950 in FIG. 9.

FIG. 12 is a configuration diagram of another embodiment of the code generation circuit 950 in FIG. 9. With reference to FIG. 12, an embodiment will be described in which, because the code generation circuit 950 operates with a threshold value, even though the asynchronous delay value of the buffer chip 220 is instantaneously changed due to power fluctuations, such fluctuations are prevented from being reflected in the delay code DELAY<0:N>.

Referring to FIG. 12, the code generation circuit 950 may include a threshold value storage circuit 1260, a subtractor 1271, an adder 1273, a comparison circuit 1210, a code change circuit 1230, and an update control circuit 1250.

The threshold value storage circuit 1260 may store a first threshold value TH1 and a second threshold value TH2. The first threshold value TH1 and the second threshold value TH2 may be set by the setting circuit 380.

The subtractor 1271 may generate a first value CUR_TH1<0:M> by subtracting the first threshold value TH1 from the current value CUR<0:M>, and the adder 1273 may generate a second value CUR_TH2<0:M> by adding the second threshold value TH2 to the current value CUR<0:M>.

The comparison circuit 1210 may activate the increase signal INC when the first value CUR_TH1<0:M> is greater than the reference value REF<0:M>. When the second value CUR_TH2<0:M> is smaller than the reference value REF<0:M>, the comparison circuit 1210 may activate the decrease signal DEC. That is, when the current value CUR<0:M> is greater than the reference value REF<0:M> by a value equal to or greater than the first threshold value TH1, the comparison circuit 1210 may activate the increase signal INC, and when the current value CUR<0:M> is less than the reference value REF<0:M> by a value less than or equal to the second threshold value TH2, the comparison circuit 1210 may activate the decrease signal DEC. That is, when the difference between the current value CUR<0:M> and the reference value REF<0:M> is within the range between the first threshold value TH1 and the second threshold value TH2, the increase signal INC and The decrease signal DEC may be deactivated, and as a result, the value of the delay code DELAY<0:N> might not be changed.

The code change circuit 1230 may increase the value of the preliminary delay code DELAY_PRE<0:N> when the increase signal INC is activated and may decrease the value of the preliminary delay code DELAY_PRE<0:N> when the decrease signal DEC is activated.

The update control circuit 1250 may prevent the preliminary delay code DELAY_PRE<0:N> generated by the code change circuit 1230 from being updated to the delay code DELAY<0:N> in a read operation period and may update the preliminary delay code DELAY_PRE<0:N> to the delay code DELAY<0:N> in a period other than the read operation period. The read signal RD may be a signal that is activated in the read operation period. The preliminary delay code DELAY_PRE<0:N> and the delay code DELAY<0:N> may have the same value in a period in which the read signal RD is deactivated, and the preliminary delay code DELAY_PRE<0:N> might not be updated to the delay code DELAY<0:N> and the delay code DELAY<0:N> may maintain the same value as before in a period in which the read signal RD is activated.

Because the code generation circuit 950 of FIG. 12 operates with a certain threshold value, even though the asynchronous delay value of the buffer chip 220 is instantaneously changed due to instantaneous power fluctuations or the like, the delay code DELAY<0:N> might not be changed. Accordingly, the delay code DELAY<0:N> may be prevented from changing too often.

Figure 13:
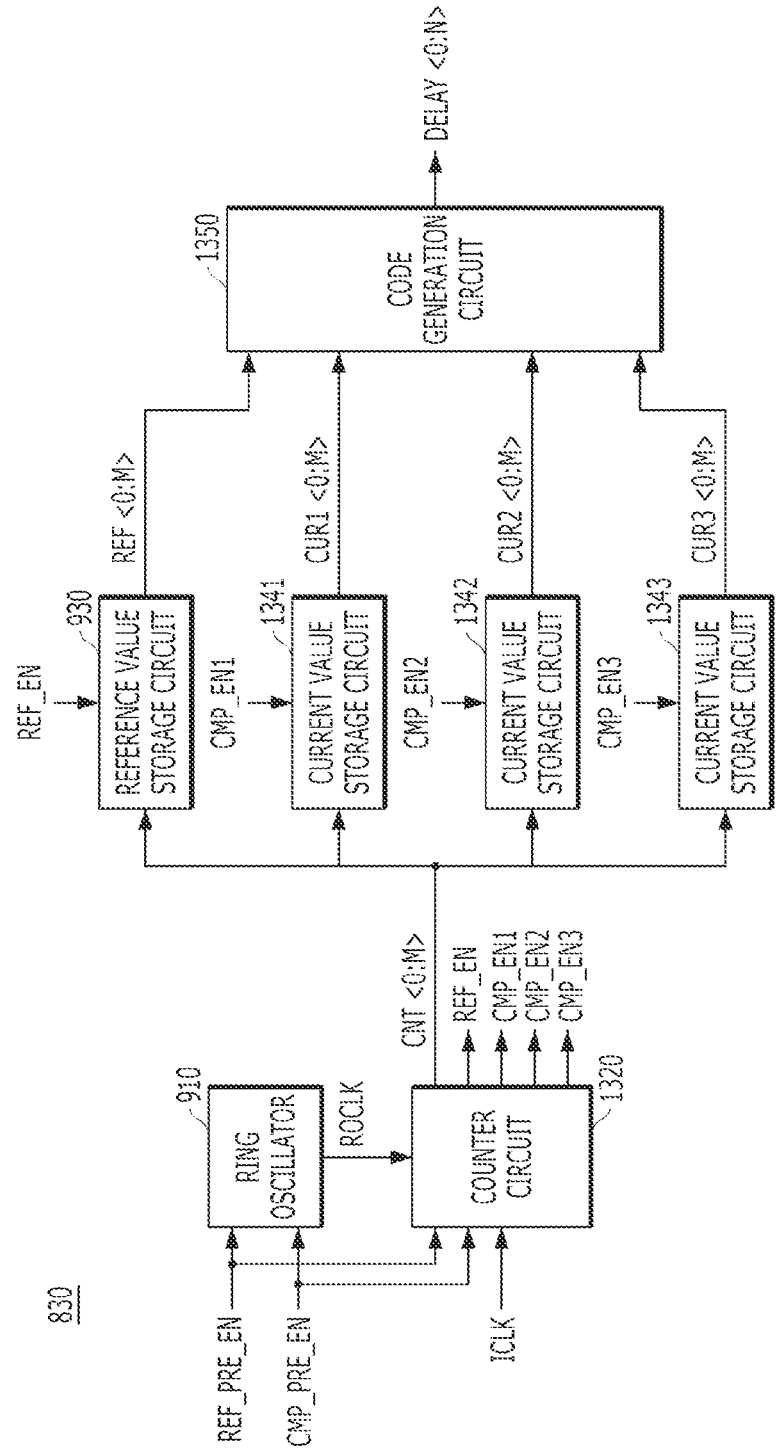
FIG. 13 is a configuration diagram of another embodiment of the delay control circuit 830 in FIG. 8.

FIG. 13 is a configuration diagram of another embodiment of the delay control circuit 830 in FIG. 8. With reference to FIG. 13, an embodiment will be described in which the delay code DELAY<0:N> is generated using first to third current values CUR1<0:M>, CUR2<0:M>, and CUR3<0:M>, which are generated at different time points.

Referring to FIG. 13, the delay control circuit 830 may include a ring oscillator 910, a counter circuit 1320, a reference value storage circuit 930, first to third current value storage circuits 1341 to 1343, and a code generation circuit 1350.

The ring oscillator 910 may generate the ring oscillator clock ROCLK. The frequency of the ring oscillator clock ROCLK may be changed according to changes in the temperature and voltage of the buffer chip 220. An internal configuration of the ring oscillator 910 may be understood with reference to FIG. 10.

The counter circuit 1320 may count the number of toggles of the ring oscillator clock ROCLK while the external clock ICLK input from a device external to the buffer chip 220 toggles a reference number of times. The counting code CNT<0:M> is the counting result of the counter circuit.

The counter circuit 1320 may operate when the preliminary reference setting signal REF_PRE_EN is activated and when the preliminary comparison signal CMP_PRE_EN is activated. The counter circuit 1320 may start a counting operation in response to the activation of the preliminary reference setting signal REF_PRE_EN and may activate the reference setting signal REF_EN when the counting operation is terminated. The preliminary reference setting signal REF_PRE_EN may be a signal for activating the counting operation of the counter circuit 1320 for generating a reference value. The counter circuit 1320 may start the counting operation in response to activation of the preliminary comparison signal CMP_PRE_EN and may activate one of first to third comparison signals CMP_EN1 to CMP_EN3 when the counting operation is terminated. The counter circuit 1320 may sequentially activate one of the first to third comparison signals CMP_EN1 to CMP_EN3 whenever the counting operation is completed. For example, when the counting operation is completed after the preliminary comparison signal CMP_PRE_EN is activated for the first time, the counter circuit 1320 may activate the first comparison signal CMP_EN1, and when the counting operation is completed after the preliminary comparison signal CMP_PRE_EN is activated for the second time, the counter circuit 1320 may activate the second comparison signal CMP_EN2. When the counting operation is completed after the preliminary comparison signal CMP_PRE_EN is activated for the third time, the counter circuit 1320 may activate the third comparison signal CMP_EN3. Whenever the preliminary comparison signal CMP_PRE_EN is activated, the counter circuit 1320 may sequentially activate the first to third comparison signals CMP_EN1 to CMP_EN3 again.

The reference value storage circuit 930 may store the counting code CNT<0:M> generated by the counter circuit 1320 as the reference value REF<0:M> in response to the activation of the reference setting signal REF_EN.

When comparison signals corresponding to the first to third current value storage circuits 1341 to 1343, among the first to third comparison signals CMP_EN1 to CMP_EN3, are activated, the first to third current value storage circuits 1341 to 1343 may store the counting code CNT<0:M> as the first to third current values CUR1<0:M>, CUR2<0:M>, and CUR3<0:M>. Because the first to third comparison signals CMP_EN1 to CMP_EN3 are activated at different time points, the first to third current values CUR1<0:M>, CUR2<0:M>, and CUR3<0:M> may be values obtained by sampling the counting code CNT<0:M> at different time points.

The code generation circuit 1350 may generate the delay code DELAY<0:N> by using the reference value REF<0:M> and the first to third current values CUR1<0:M>, CUR2<0:M>, and CUR3<0:M>.

Although FIG. 13 illustrates that the delay control circuit 830 includes the three current value storage circuits 1341 to 1343, it is merely an embodiment, and the number of current value storage circuits may be 2 or 4 or more depending on the embodiment.

Figure 14:
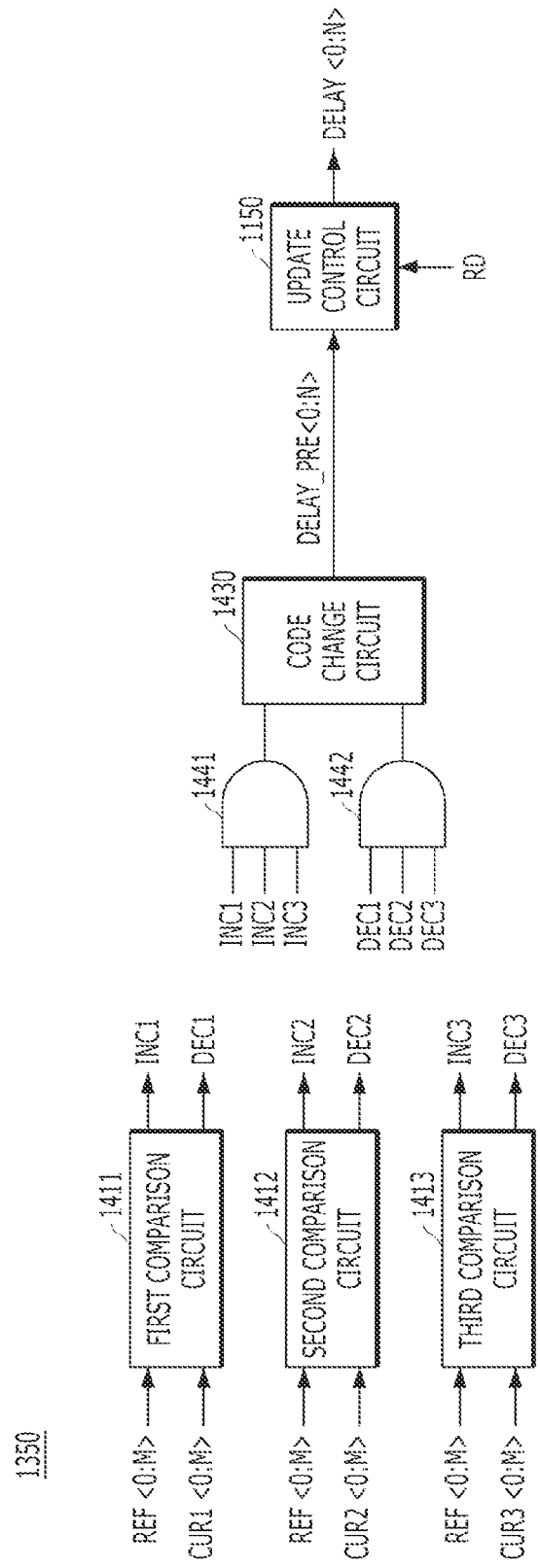
FIG. 14 is a configuration diagram of an embodiment of a code generation circuit 1350 in FIG. 13.

FIG. 14 is a configuration diagram of an embodiment of the code generation circuit 1350 in FIG. 13.

Referring to FIG. 14, the code generation circuit 1350 may include first to third comparison circuits 1411 to 1413, a code change circuit 1430, an update control circuit 1150, and AND gates 1441 to 1442.

The first comparison circuit 1411 may generate a first increase signal INC1 and a first decrease signal DEC1 by comparing the reference value REF<0:M> with the first current value CUR1<0:M>. When the first current value CUR1<0:M> is greater than the reference value REF<0:M>, the first comparison circuit 1411 may activate the first increase signal INC1. When the first current value CUR1<0:M> is less than the reference value REF<0:M>, the first comparison circuit 1411 may activate the first decrease signal DEC.

The second comparison circuit 1412 may generate a second increase signal INC2 and a second decrease signal DEC2 by comparing the reference value REF<0:M> with the second current value CUR2<0:M>. When the second current value CUR2<0:M> is greater than the reference value REF<0:M>, the second comparison circuit 1412 may activate the second increase signal INC2. When the second current value CUR2<0:M> is smaller than the reference value REF<0:M>, the second comparison circuit 1412 may activate the second decrease signal DEC2.

The third comparison circuit 1413 may generate a third increase signal INC3 and a third decrease signal DEC3 by comparing the reference value REF<0:M> with the third current value CUR3<0:M>. When the third current value CUR3<0:M> is greater than the reference value REF<0:M>, the third comparison circuit 1413 may activate the third increase signal INC3. When the third current value CUR3<0:M> is less than the reference value REF<0:M>, the third comparison circuit 1413 may activate the third decrease signal DEC3.

The AND gate 1441 may receive the first to third increase signals INC1 to INC3. An output signal of the AND gate 1141 may be activated to a high level only when all the first to third increase signals INC1 to INC3 are activated to a high level. The AND gate 1442 may receive the first to third decrease signals DEC1 to DEC3. An output signal of the AND gate 1442 may be activated to a high level only when all the first to third decrease signals DEC1 to DEC3 are activated to a high level.

The code change circuit 1430 may increase the value of the preliminary delay code DELAY_PRE<0:N> when the output signal of the AND gate 1441 is activated to a high level and may decrease the value of the preliminary delay code DELAY_PRE<0:N> when the output signal of the AND gate 1442 is activated to a high level. That is, the code change circuit 1430 may increase the value of the preliminary delay code DELAY_PRE<0:N> when all the first to third increase signals INC1 to INC3 are activated and may decrease the value of the preliminary delay code DELAY_PRE<0:N> when all the first to third decrease signals DEC1 to DEC3 are activated.

The update control circuit 1150 may prevent the preliminary delay code DELAY_PRE<0:N> generated by the code change circuit 1130 from being updated to the delay code DELAY<0:N> in a read operation period and may update the preliminary delay code DELAY_PRE<0:N> to the delay code DELAY<0:N> in a period other than the read operation period. The read signal RD may be a signal that is activated in the read operation period, the preliminary delay code DELAY_PRE<0:N> and the delay code DELAY<0:N> may have the same value in a period in which the read signal RD is deactivated, and the preliminary delay code DELAY_PRE<0:N> might not be updated to the delay code DELAY<0:N> and the delay code DELAY<0:N> may maintain the same value as before in a period in which the read signal RD is activated.

The code generation circuit 1350 may change the value of the delay code DELAY<0:N> only when all the first to third increase signals INC1 to INC3 have the same value or when all the first to third decrease signals DEC1 to DEC3 have the same value. Accordingly, even though the asynchronous delay value of the buffer chip 220 is instantaneously changed only for a short time, the value of the delay code DELAY<0:N> may be prevented from changing.

Although embodiments according to the technical idea of the present disclosure have been described above with reference to the accompanying drawings, this is only for explaining the embodiments according to the concept of the present disclosure, and the present disclosure is not limited to the above embodiments. Various types of substitutions, modifications, and changes for the embodiments may be made by those skilled in the art, to which the present disclosure pertains, without departing from the technical idea of the present disclosure defined in the following claims, and it should be construed that these substitutions, modifications, and changes belong to the scope of the present disclosure.

What is claimed is:

1. A buffer chip comprising:
   a control signal transmission path transmitting, to a memory chip, control signals transmitted from a memory controller;
   a data transmission path including a variable delay circuit having a delay value adjusted by a delay code and transmitting, to the memory controller, data transmitted from the memory chip;
   a ring oscillator generating a ring oscillator clock;
   a counter circuit configured to count the number of toggles of the ring oscillator clock while an external clock toggles a reference number of times;
   a reference value storage circuit configured to store a counting value of the counter circuit as a reference value in response to a reference setting signal;
   a current value storage circuit configured to store the counting value of the counter circuit as a current value in response to a comparison signal; and
   a code generation circuit configured to generate the delay code by comparing the reference value with the current value.

2. The buffer chip of claim 1, wherein the ring oscillator includes a replica delay circuit configured to replicate asynchronous delay values of the control signal transmission path and the data transmission path.

3. The buffer chip of claim 2, wherein the control signal transmission path comprises:
   control signal reception buffers configured to receive the control signals;
   a control signal transmission circuit configured to buffer control signals received by the reception buffers, in synchronization with the external clock; and
   control signal transmission drivers configured to transmit, to the memory chip, the control signals transmitted through the control signal transmission circuit, and
   the data transmission path comprises:
   data reception buffers configured to receive the data from the memory chip;
   the variable delay circuit configured to delay the data received through the data reception buffers; and data transmission drivers configured to transmit the data delayed by the variable delay circuit to the memory controller, wherein the asynchronous delay values include delay values of the control signal reception buffers, delay values of the control signal transmission drivers, delay values of the data reception buffers, and delay values of the data transmission drivers.

4. The buffer chip of claim 1, wherein the reference setting signal is activated in response to at least one of a read training operation, termination of a self-refresh mode, and a ZQ calibration operation.

5. The buffer chip of claim 1, wherein the code generation circuit comprises:
a comparison circuit configured to compare the reference value with the current value; and
a code change circuit configured to increase or decrease a value of the delay code according to a comparison result of the comparison circuit.

6. The buffer chip of claim 1, wherein the code generation circuit comprises:
a comparison circuit configured to activate a decrease signal when the current value is less than the reference value by a less than or equal to a first threshold value and configured to activate an increase signal when the current value is greater than the reference value by a value equal to or greater than a second threshold value or more; and
a code change circuit configured to decrease a value of the delay code when the decrease signal is activated and configured to increase the value of the delay code when the increase signal is activated.

7. The buffer chip of claim 1, wherein, in a period in which the data transmission path transmits the data, the delay code is not updated from the code generation circuit to the variable delay circuit.

8. An integrated circuit chip comprising:
a variable delay circuit having a delay value adjusted by a delay code and delaying an input signal;
a ring oscillator generating a ring oscillator clock;
a counter circuit configured to count the number of toggles of the ring oscillator clock while an external clock toggles a reference number of times;
a reference value storage circuit configured to store a counting value of the counter circuit as a reference value in response to a reference setting signal;
a current value storage circuit configured to store the counting value of the counter circuit as a current value in response to a comparison signal; and
a code generation circuit configured to generate the delay code by comparing the reference value with the current value.

9. A semiconductor package comprising:
a package substrate including a plurality of terminals for communicating with a memory controller and a plurality of bonding pads for communicating with components inside a package;
a buffer chip disposed on the package substrate;
a plurality of memory chips stacked on the buffer chip; and
a plurality of wires connecting the plurality of bonding pads with the plurality of memory chips,
wherein the buffer chip is configured to communicate with the memory controller through the plurality of terminals of the package substrate,
wherein the plurality of memory chips is configured to communicate with the buffer chip through the plurality of wires and the plurality of bonding pads of the package substrate, and
wherein the buffer chip comprises:
a control signal transmission path transmitting, to the plurality of memory chips, control signals transmitted from the memory controller;
a data transmission path including a variable delay circuit having a delay value adjusted by a delay code and transmits, to the memory controller, data transmitted from one of the plurality of memory chips;
a ring oscillator generating a ring oscillator clock;
a counter circuit configured to count the number of toggles of the ring oscillator clock while an external clock toggles a reference number of times;
a reference value storage circuit configured to store a counting value of the counter circuit as a reference value in response to a reference setting signal;
a current value storage circuit configured to store the counting value of the counter circuit as a current value in response to a comparison signal; and
a code generation circuit configured to generate the delay code by comparing the reference value with the current value.

10. The semiconductor package of claim 9, wherein the reference setting signal is activated in response to at least one of during a read training operation, termination of a self-refresh mode, and during a ZQ calibration operation.

11. The semiconductor package of claim 9, wherein the code generation circuit comprises:
a comparison circuit configured to activate a decrease signal when the current value is less than the reference value by a less than or equal to a first threshold value and configured to activate an increase signal when the current value is greater than the reference value by a value equal to or greater than a second threshold value; and
a code change circuit configured to decrease a value of the delay code when the decrease signal is activated and configured to increase the value of the delay code when the increase signal is activated.

* * * * *